United States Patent
Chen

(10) Patent No.: US 7,373,282 B2
(45) Date of Patent: May 13, 2008

(54) FAULT SEVERITY CHECK AND SOURCE IDENTIFICATION

(75) Inventor: Xiaofen Chen, West Linn, OR (US)

(73) Assignee: Tektronix, Inc., Beaverton, OR (US)

( * ) Notice: Subject to any disclaimer, the term of this patent is extended or adjusted under 35 U.S.C. 154(b) by 1140 days.

(21) Appl. No.: 10/210,552

(22) Filed: Jul. 31, 2002

(65) Prior Publication Data

US 2004/0022195 A1 Feb. 5, 2004

(51) Int. Cl.
*H04J 1/16* (2006.01)

(52) U.S. Cl. ............ 702/191; 704/224; 704/225; 704/229; 704/230; 370/210; 370/242; 702/108

(58) Field of Classification Search ........ 702/191; 324/527–533

See application file for complete search history.

(56) References Cited

U.S. PATENT DOCUMENTS 4,314,249 A * 2/1982 Onoe ................. 342/6
5,974,379 A * 10/1999 Hatanaka et al. ........ 704/225
6,542,112 B1 * 4/2003 Chen et al. ............ 342/165
2003/0035376 A1 * 2/2003 Chen ................... 370/242

OTHER PUBLICATIONS

Biggerstaff, W.F., A Transmission Line and Radiating System Measurement, Jun. 1957, vol. 9, Issue 1, pp. 75-81.*
Seeger, John. Microwave Theory, Components, and Devices. pp. 83-107.*

* cited by examiner

*Primary Examiner*—John Barlow
*Assistant Examiner*—Sujoy Kundu
(74) *Attorney, Agent, or Firm*—Francis I. Gray; Michael A. Nelson

(57) ABSTRACT

A fault severity check and source identification method for a frequency domain instrument accesses acquired reflection data for a transmission line under test. From the acquired data reflection surfaces are isolated as a function of distance. Each reflection surface is examined to produce a frequency response profile and a worst-case reflection response to determine fault severity. The frequency response profile may also be correlated in a pattern recognition algorithm with known reference source profiles to determine the source identification for the fault.

5 Claims, 4 Drawing Sheets

TYPE I

TYPE II

FAULT SEVERITY CHECK AND SOURCE IDENTIFICATION

BACKGROUND OF THE INVENTION

The present invention relates to transmission line testing, and more particularly to a method of determining the nature of a transmission discontinuity (fault) and its severity.

In transmission line testing it is very important to know not only the distance to a transmission discontinuity, but also the nature of the fault causing the discontinuity and its severity. For frequency domain based measurements, due to the frequency selective nature of most reflection responses, the distance-to-fault (DTF) result sometimes does not reflect the actual severity of the problem. For example a transmission line with a severe corrosion problem when stimulated with a step-function waveform shows a large reflection, as shown in FIG. 1b, but may only show a small reflection when stimulated with an impulse response or with swept tones of no low frequency components, as shown in FIG. 1a, which is hardly distinguishable from some non-harmful reflections. Where a test instrument uses a simple impulse-like signal source by stepping a sinusoid through a frequency range of interest, such as from 24 MHz up, it has the potential of missing the severity of built-up deterioration.

In an antenna system the most common problems are corrosion and watering. FIGS. 2a and 2b show the types of terminating impedances associated with each of these problems, with FIGS. 3a and 3b showing the frequency responses for the resultant reflections. Different terminating impedances have different frequency responses. When there are more than one reflection surface in the transmission line, the characteristic of the frequency response profile for the measured reflection is usually hard to categorize. FIGS. 4a and 4b show the frequency response and the reflection magnitude response of a system with both Type-I and Type-II impedances. As seen the spectral profile in FIG. 4a is neither the Type-I nor the Type-II profile shown in FIG. 3a or 3b.

What is desired is a method of determining not only the distance to a transmission discontinuity but also the nature of the fault causing the discontinuity and its severity, especially in situations where the characteristic of a frequency response profile for the measured reflection is difficult to categorize.

BRIEF SUMMARY OF THE INVENTION

Accordingly the present invention provides a fault severity check and source identification for transmission line discontinuities by initially isolating separate reflection surfaces from acquired reflection data for a transmission line under test. The localization or isolation of the separate reflection surfaces may be achieved using a suitable windowing technique on the acquired reflection data and locating the window within the data may be either user-interactive or automatic. The frequency response profiles for the isolated reflection surfaces are extracted and a worst-case reflection response is examined. The results are graphically displayed for a user. Further the frequency response profiles may be correlated against known reference source response profiles using pattern matching techniques to determine the source identification for the isolated reflection surface. The result of the pattern recognition also is displayed alpha-numerically for the user. Where the results of the pattern matching are uncertain, a list of source candidates may be displayed which have large correlation coefficients.

The objects, advantages and other novel features of the present invention are apparent from the following detailed description when read in conjunction with the appended claims and attached drawing.

DETAILED DESCRIPTION OF THE INVENTION

In order to determine fault severity and source identification the first step is to isolate each reflection surface from reflection data for a transmission line under test. To achieve such isolation a time window is applied at the distance area showing some reflection activity of interest. There are at least two ways a time window function, such as a rectangular window, may be applied: direct multiplication in the time domain or convolution in the frequency domain.

An example of direct manipulation in the time domain may be as follows:

$$x(n,\tau)=h(n)w(n-\tau)=\{h(n) \text{ for } \tau-L/2<=n<=\tau+L/2;\ 0 \text{ for others}\}$$

where $\tau$ is the center of the selected area and L is the window length.

For convolution in the frequency domain, where H(k) is an original one-sided reflection frequency response and an extended response is:

$$\theta_0 = \angle H(0)$$

$$H_0(k) = H(k)e^{-j\theta_0}$$

$$H_{ex}(k)=\{H_0^*(L-k) \text{ for } 0<=k<L;\ H_0(k-L) \text{ for } L<=k<=L+N;\ H_0^*(N+L-k) \text{ for } L+N<k<=2L+N\}$$

where N are the points of H(k), a window response may be truncated as:

$$W_0(k)=DFT(w(n-L/2),N)$$

$$W(k)=\{W_0^*(L-k) \text{ for } 0<=k<L;\ W_0(k-L) \text{ for } L<=k<=2L\}$$

For a selected area $$W_s(k)=W(k)e^{-j2\pi(\tau-L/2)(k-L)/N}$$

$$H_s(k)=e^{j\theta_0}\Sigma_{i=0-2L}H_{ex}(k+i)W_s(2L-i)$$

Theoretically these two methods of applying a time window are equivalent, but simulation shows a better result with the frequency-domain approach.

Figure 1A:
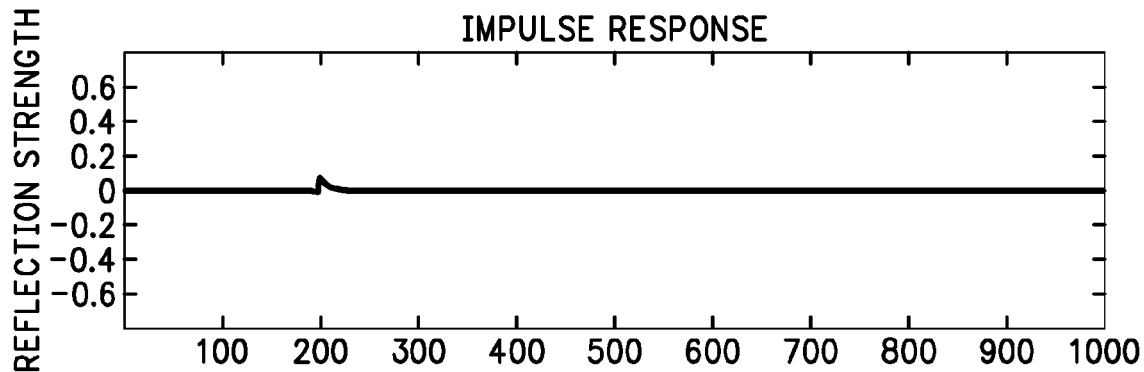
FIGS. 1a and 1b graphically illustrate both the step response and impulse response of a severe corrosion-type discontinuity in a transmission line.
Figure 1B:
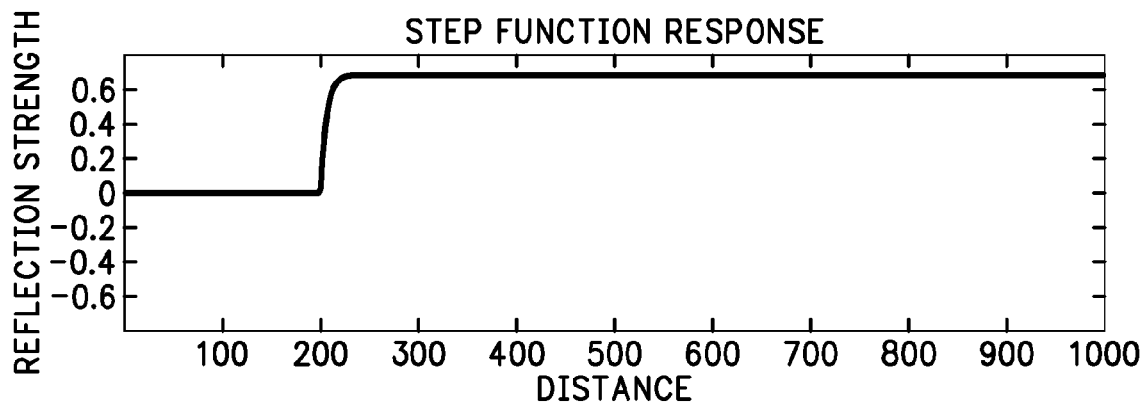
Figure 2A:
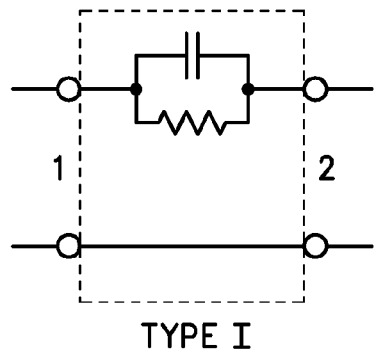
FIGS. 2a and 2b are representative impedance circuits for two different types of faults that may occur in a transmission line.
Figure 2B:
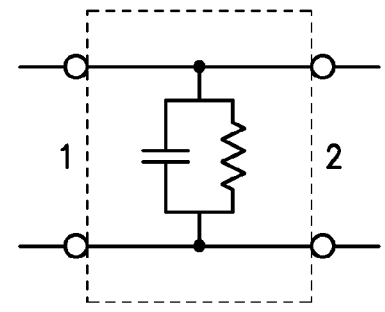
Figure 3A:
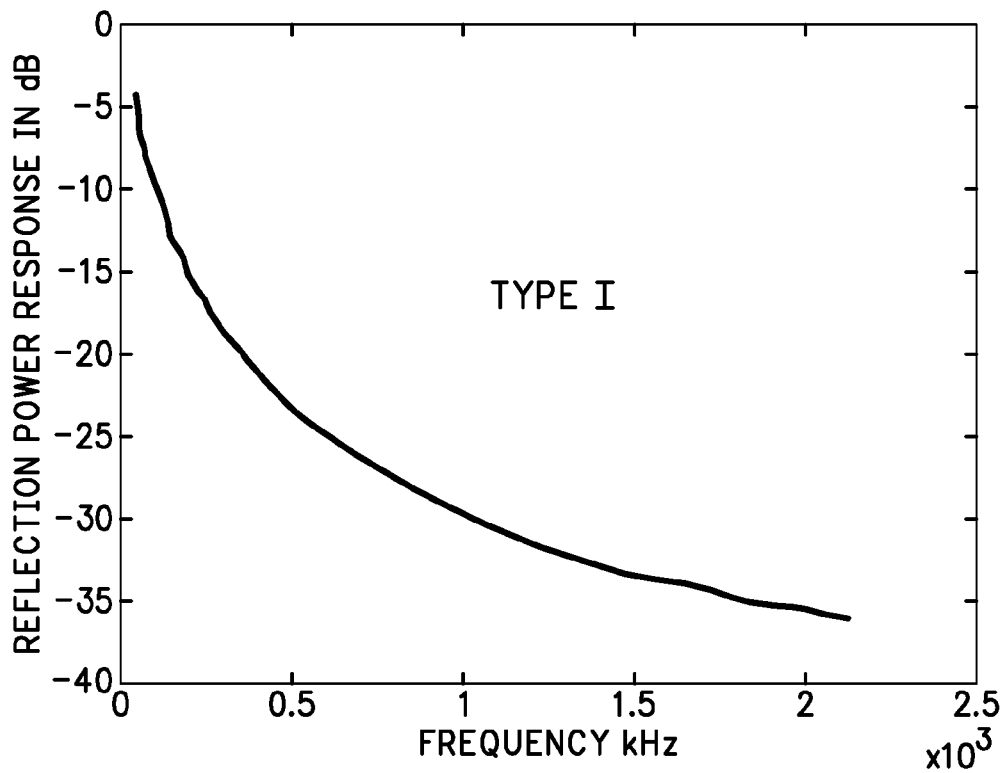
FIGS. 3a and 3b are graphical frequency response profiles for the types of faults shown in FIGS. 2a and 2b.
Figure 3B:
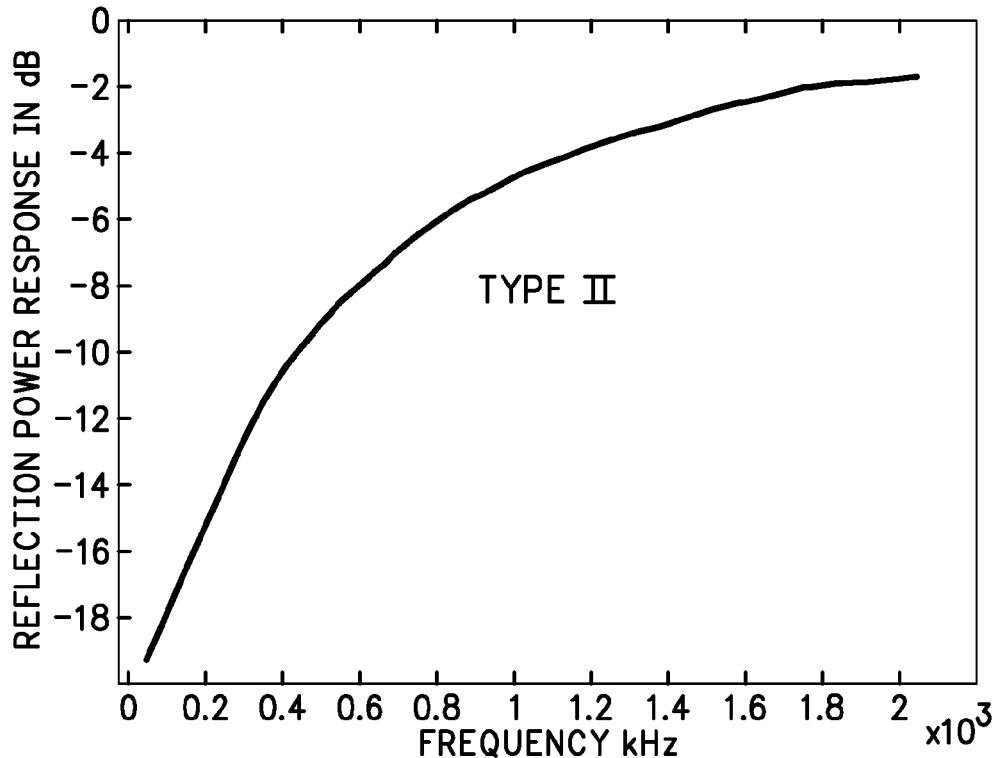
Figure 4A:
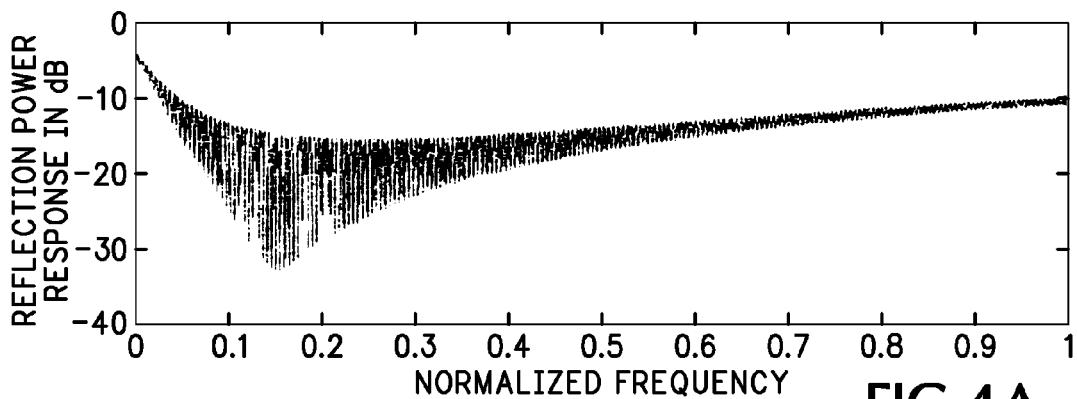
FIGS. 4a and 4b are graphical frequency and impulse responses of a transmission line having both types of faults.
Figure 4B:
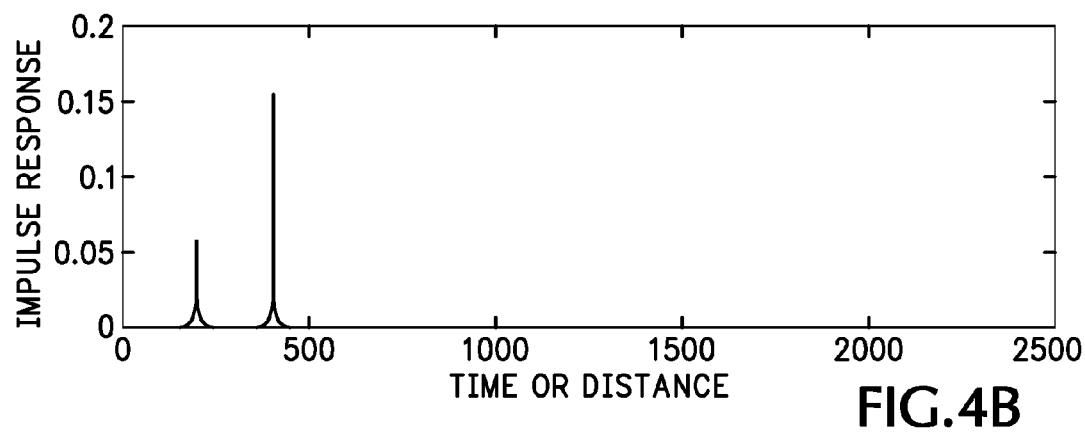
Figure 5A:
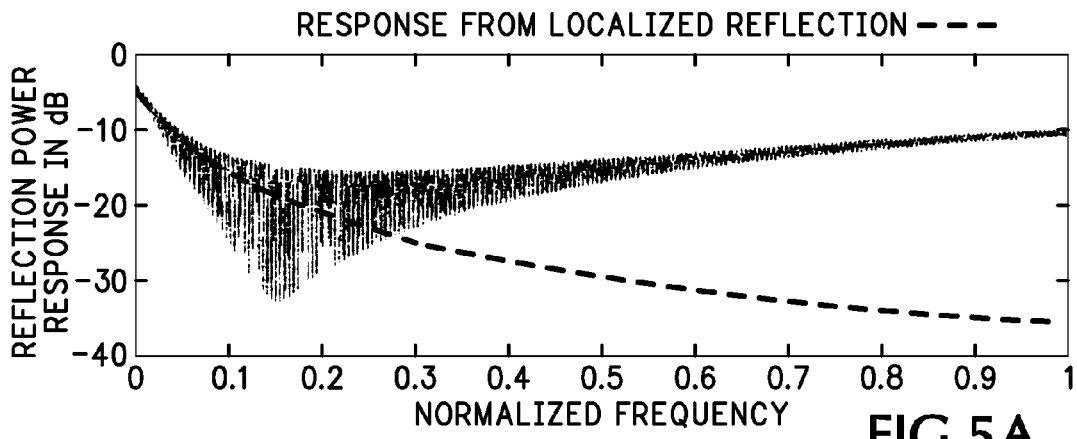
FIGS. 5a and 5b are graphical frequency and impulse responses for a first localized reflection pulse detected according to the present invention.
Figure 6A:
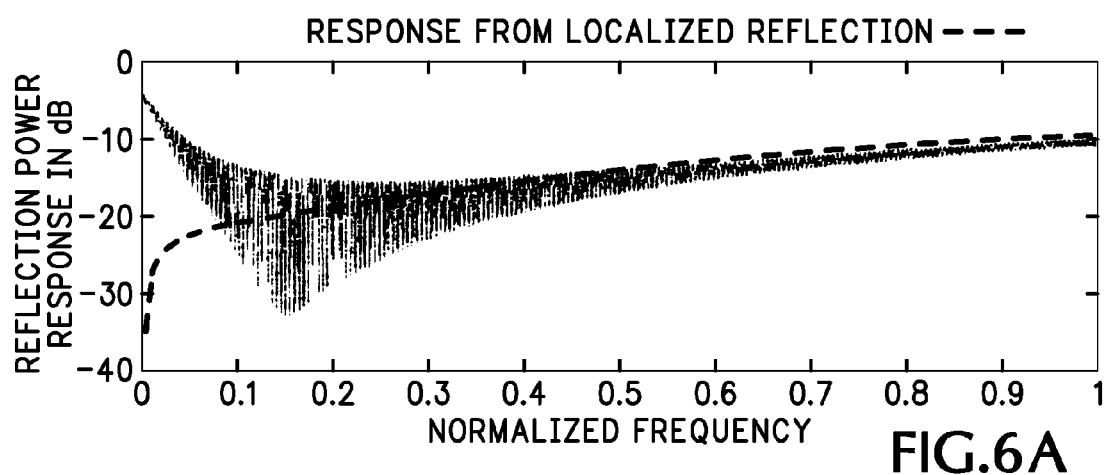
FIGS. 6a and 6b are graphical frequency and impulse responses for a second localized reflection pulse detected according to the present invention.

The frequency responses of isolated first and second reflection pulses for the frequency response profile shown in FIG. 4a are shown respectively in FIGS. 5a and 6a. The reflection area identification may be automatic or user-interactive. In the user-interactive mode the user inputs the distance area of interest, whereas in the automatic mode fault location is based on the distance-to-fault's magnitude.

Fault severity may be checked by examining the worst-case reflection response. The frequency response H(f) of a localized fault surface is scaled to its maximum magnitude value while maintaining its phase response. Since the phase response is unchanged, the resulting impulse response has the same timing information and similar shape as the original response. Since each frequency bin only receives $(1/N)^{th}$ of the total input power, giving all the input power to that particular frequency with maximum magnitude produces a response N times stronger. Based on Parseval's theorem, it is close to the response in magnitude if H(f) is leveled to its maximum value.

$$A_{max} = \max_f(|H(f)|)$$

$$H'_{worst}(f) = A_{max}\{H(f)/|H(f)|\}$$

$$h'_{worst}(t) = f_{DTF}(H'_{worst}(f))$$

Figure 5B:
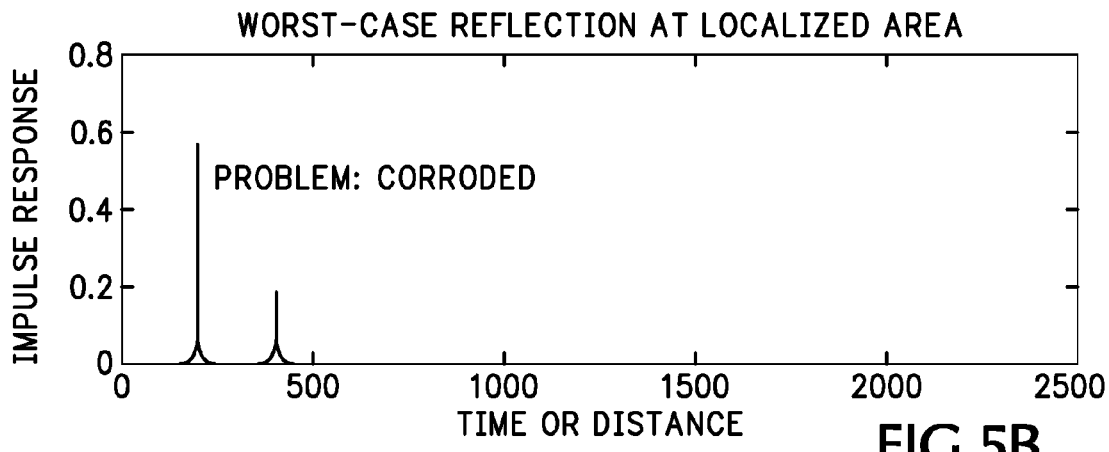
Figure 6B:
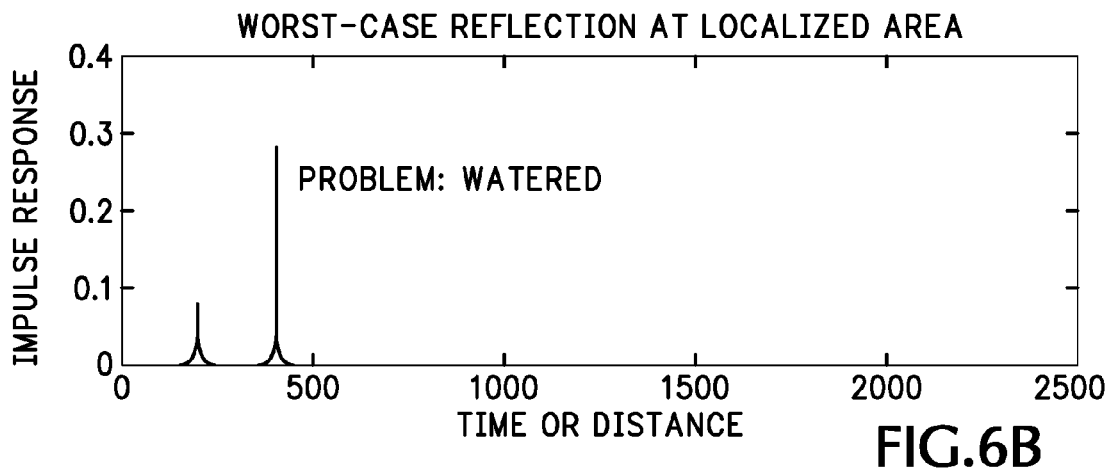

Here $f_{DTF}$ is the distance-to-fault function. FIGS. 5a and 6a show the frequency response of the localized/isolated reflection pulses and FIGS. 5b and 6b show the associated worst-case reflection response. Although isolated, the first reflection source may still have some effect on the second reflection pulse. To overcome that additional deconvolution, or peeling-off, processing may be used.

The frequency location of the maximum frequency response $A_{max}$ may also be useful in providing information to a user in diagnosing the severity of the problem.

Source identification is achieved by pattern recognition. The response pattern or model of the localized reflection source is compared with a library of known responses/models. One simple pattern recognition scheme is to perform a correlation of power spectrum between the localized response and each reference source response. The source with the maximum correlation coefficient is identified as that of the localized response. For example $$S(k) = 20 \log 10|H_x(k)|$$

$$\rho(i) = \{1/N\Sigma_{k=1-N}(S(k)-S^*)(R(i,k)-R^*(i)\}/\{SQRT((1/N\Sigma_{k=1-N}(S(k)-S^*)^2)(SQRT1/N\Sigma_{k=1-N}(R(i,k)-R^*(i))^2)\}$$

where R(i,k) is the $i^{th}$ reference and the "*" represents the average value. Since each measurement may have a different frequency span and frequency swept range, the reference source responses may be parametrically modeled rather than waveform coded. One such parametric model is:

$$Y(k) = a(1) + a(2)SQRT(F(k)) + a(3)(1/SQRT(F(k))) + a(4)F(k) + a(5)(1/F(k))$$

where F(k) is a frequency value in MHz of the $k^{th}$ data point. An LS estimation of the model coefficients is derived from $$A = (D^T D)^{-1} D^T Y$$

$$A = [a(1)a(2)a(3)a(4)a(5)]^T$$

$$D = \begin{bmatrix} 1 & SQRT(F(1)) & 1/SQRT(F(1)) & F(1) & 1/F(1) \\ 1 & SQRT(F(2)) & 1/SQRT(F(2)) & F(2) & 1/F(2) \\ & & & & \\ 1 & SQRT(F(N)) & 1/SQRT(F(N)) & F(N) & 1/F(N) \end{bmatrix}$$

$$Y = [Y(1)Y(2) \ldots Y(N)]^T$$

To account for uncertainty it also is informative to provide the user with a list of other source candidates with large correlation coefficients.

Thus the present invention provides a means for determining fault severity and source identification by isolating reflection surfaces from acquired reflection data for a transmission line under test, examining the frequency profile for the isolated reflection surface to determine fault severity, and correlating the frequency profile with known reference source profiles to determine the type of fault.

What is claimed is:

1. A method in a frequency domain based instrument of determining fault severity and source identification in a transmission line under test comprising the steps of:
   isolating from acquired reflection data for the transmission line a reflection surface;
   examining a frequency response for the reflection surface within a region around the isolated reflection surface;
   displaying the frequency response; and
   correlating the frequency response of the reflection surface with a library of frequency responses of known sources to determine a likely source of the reflection surface, the likely source being provided for display in the displaying step.

2. The method as recited in claim 1 wherein the correlating step comprises the steps of:
   correlating a power spectrum for the reflection surface in the region with a power spectrum for each known source to produce a correlation coefficient for each known source with respect to the reflection surface; and
   selecting as the likely source the known source having a maximum correlation coefficient.

3. The method as recited in claim 2 wherein the known sources comprise the group consisting of corrosion and watering.

4. The method as recited in claim 2 further comprising the step of providing together with the likely source a list of other likely sources from the known sources for display in the displaying step where the correlation coefficients are within a given margin of the maximum coefficient.

5. The method as recited in claim 1 further comprising the step of providing together with the likely source a list of other likely sources from the known sources for display in the displaying step.

* * * * *